United States Patent
Smith, Jr.

(10) Patent No.: US 8,113,072 B1
(45) Date of Patent: Feb. 14, 2012

(54) ELECTROMAGNETIC PHYSICAL SCALE MODEL MODULARIZATION SYSTEM

(75) Inventor: Jerry Rosson Smith, Jr., Alexandria, VA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 470 days.

(21) Appl. No.: 12/380,882

(22) Filed: Feb. 27, 2009

(51) Int. Cl.
*G01R 33/02* (2006.01)

(52) U.S. Cl. ..................................... 73/866.4
(58) Field of Classification Search ................. 73/866.4
See application file for complete search history.

(56) References Cited

U.S. PATENT DOCUMENTS

| | | | |
|---|---|---|---|
| 4,275,449 A | 6/1981 | Aish | |
| 4,575,330 A | 3/1986 | Hull | |
| 4,859,805 A | 8/1989 | Kawakami et al. | |
| 4,929,402 A | 5/1990 | Hull | |
| 5,057,971 A * | 10/1991 | Hautvast et al. | 361/740 |
| 5,189,590 A | 2/1993 | Schneider | |
| 5,463,523 A | 10/1995 | Holmes et al. | |
| 5,483,410 A | 1/1996 | Holmes et al. | |
| 5,975,908 A | 11/1999 | Hulten | |
| 6,798,632 B1 | 9/2004 | Holmes et al. | |
| 6,965,505 B1 | 11/2005 | Mack et al. | |
| 7,082,387 B1 | 7/2006 | Wolfe, Jr. | |
| 7,439,972 B2 | 10/2008 | Timcenko | |
| 7,451,719 B1 | 11/2008 | Fitzpatrick et al. | |
| 7,458,149 B2 * | 12/2008 | Nakagawa | 29/846 |
| 2006/0081476 A1 | 4/2006 | Nakagawa | |
| 2008/0187889 A1 | 8/2008 | Kuhn | |

OTHER PUBLICATIONS

John J. Holmes, "Modeling a Ship's Ferromagnetic Signatures," Synthesis Lectures on Computational Electromagnetics, Jul. 20, 2007 (81 pages).
John J. Holmes, "Application of Models in the Design of Underwater Electromagnetic Signature Reduction Systems," Naval Engineers Journal, vol. 119, Issue 4, pp. 19-29, published online Jan. 22, 2008.
Robert Pillsbury, "New Electromagnetic Formulation Helps Navy Protect Ships from Mines," Military Embedded Systems website, http://ww.mil-embedded.com/articles/authors/pillsbury/, 2008; printed out Dec. 10, 2008 (9 pages).
U.S. Appl. No. 13/100,059, inventors Donald E. Pugsley et al., invention title "Roll Frequency Dependency Correction to Control Magnetic Ship Signatures," USPTO filed May 3, 2011 (copending application—not appended hereto).

* cited by examiner

*Primary Examiner* — Hezron E Williams
*Assistant Examiner* — Paul West
(74) *Attorney, Agent, or Firm* — Howard Kaiser

(57) ABSTRACT

The present invention's physical scale model (PSM) of a full-scale ship and associated degaussing system is typically embodied to include: an electrically wired, open, box-shaped framework; electronic structural modules; non-modular structural components; and, non-modular electronic components. Each edge-segment has alternating elevations and depressions for "tongue-in-groove" attachment thereto of modules and non-modular structural components, which are complimentarily raised and recessed and include selected quantities of ferromagnetic and electrically conductive material. Each module includes a ferromagnetic, electrically conductive, dimensionally scaled skin on the circuitous surface of a printed wiring board (PWB). The ferromagnetic and electrically conductive attributes of modules and non-modular structural components serve to simulate electromagnetic effects of corresponding areas (e.g., hull sections, decks, bulkheads, etc.) of the full-scale ship. The inventive PSM's circuitry (including framework wiring, PWB wiring, and electronic components electrically connected to modules on sides opposite their skins) serves to simulate electromagnetic effects of the degaussing system.

8 Claims, 7 Drawing Sheets

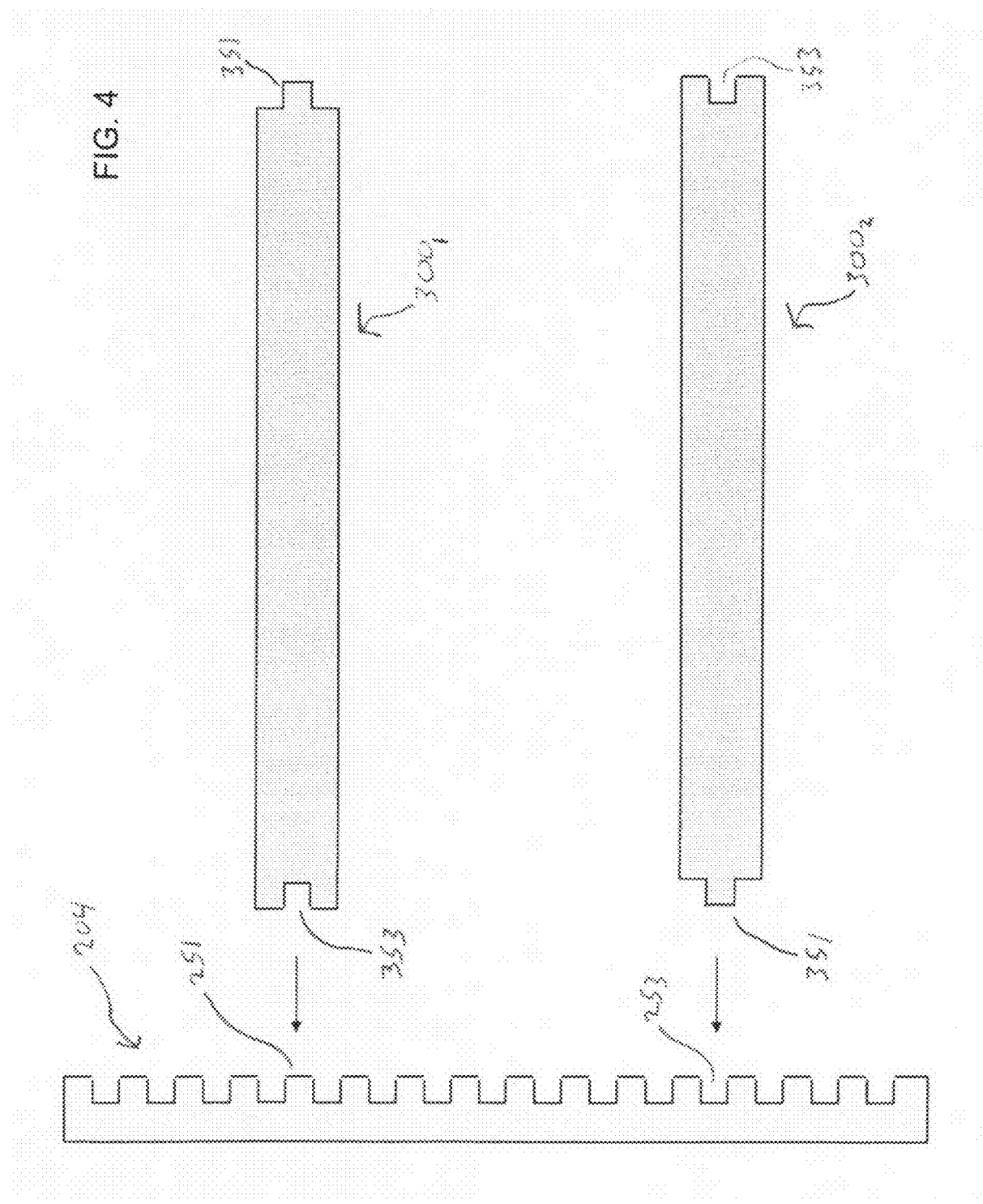

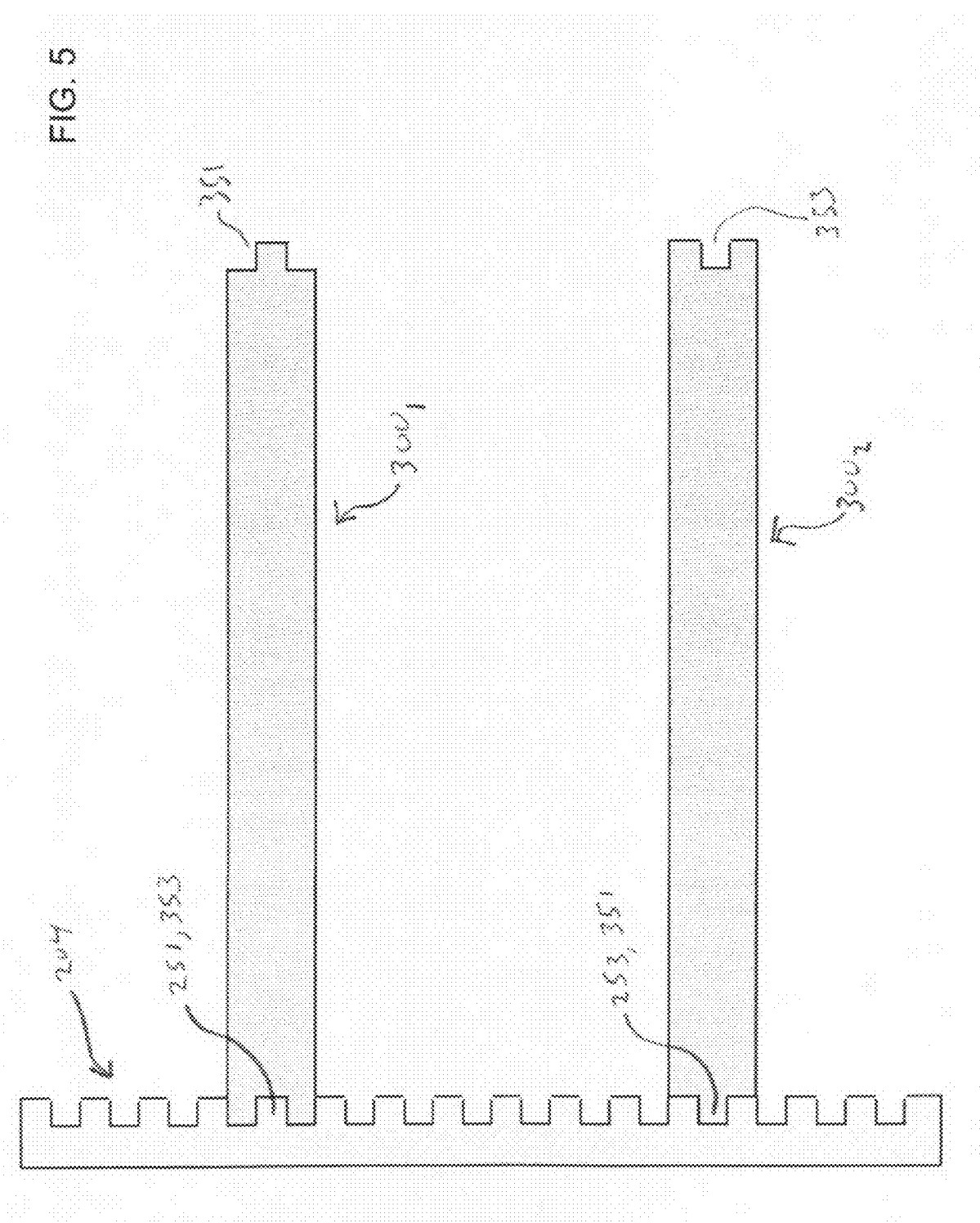

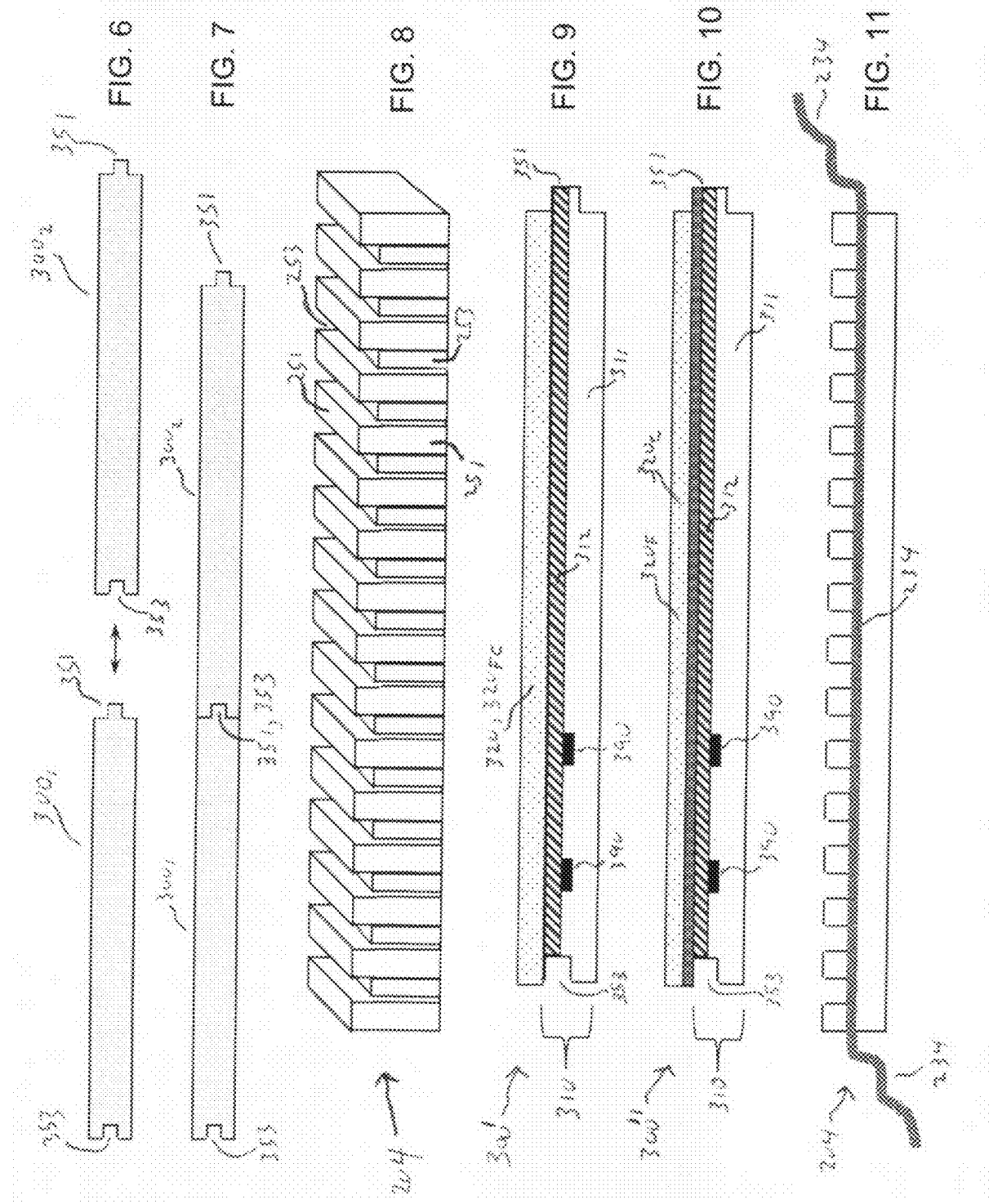

ELECTROMAGNETIC PHYSICAL SCALE MODEL MODULARIZATION SYSTEM

BACKGROUND OF THE INVENTION

The present invention relates to magnetic signatures of structures such as naval ships, more particularly to physical modeling (e.g., for testing purposes) of such structures and of electronic systems utilizable for reducing their magnetic signatures.

Naval vessels are characterized by magnetic signatures that may be detectable by enemy devices. For instance, a ship's magnetic signature may render the ship susceptible to magnetic mines. Navies therefore implement various methods and systems for reducing magnetic signatures.

Conventional practice of magnetic signature reduction usually involves degaussing. Typical degaussing practice uses magnetometers, degaussing coils, and a computer (which executes a degaussing algorithm) to measure onboard magnetic fields and to estimate offboard magnetic fields. Basically, degaussing actively compensates for the induced and permanent magnetic signals of a ship.

Technical evaluation is usually required prior to deployment of a magnetic signature reduction system that is contemplated for a given ship. Such testing of the efficacy of a proposed magnetic signature reduction system may involve computer simulation and/or physical scale modeling. According to conventional design philosophy for a physical scale model (PSM) of a ship or other marine vessel, the structures and electronics of the PSM are artistically and laboriously fabricated with a view to matching the particular configurative details of the full-scale vessel and the magnetic signature reduction system being tested.

Construction of a conventional PSM can be difficult. In addition, once constructed, the conventional PSM does not lend itself to modification, since it essentially "seals up" the inner details within its outer skin; any design changes, corrections, or adjustments will thus require that the PSM be physically cut open, an expensive and time-consuming process.

The following references, each of which is incorporated herein by reference, are instructive on conventional practice of physical scale models: John J. Holmes, "Modeling a Ship's Ferromagnetic Signatures," *Synthesis Lectures on Computational Electromagnetics*, 20 Jul. 2007; John J. Holmes, "Application of Models in the Design of Underwater Electromagnetic Signature Reduction Systems," *Naval Engineers Journal*, Volume 119, Issue 4, pages 19-29, published online 22 Jan. 2008; S. Fry and C. E. Barthel, Jr., "Design and Construction of the Magnetic Model of the DE-52," Naval Ordnance Laboratory, Washington, D.C., Technical Report NOLR 811, January 1947.

SUMMARY OF THE INVENTION

In view of the foregoing, an object of the present invention is to provide improved method and system for physically modeling a marine vessel and degaussing apparatus associated therewith.

A typical physical scale model (PSM) according to the present invention is suitable for magnetic signature evaluation of a full-scale structure having magnetic signature reduction apparatus associated therewith. The present invention's PSM, as typically embodied, is generally representative of the geometric shape of the full-scale structure. The framework of the inventive PSM includes electrical wiring and plural edge-segments. The edge-segments form a geometric shape that at least substantially is axially symmetrical. Plural structural electronic modules are combined with the framework. Plural electronic components are combined with the modules. Plural structural components are combined with the framework.

Each module includes a printed wire board and at least one material layer situated upon the printed wire board. The printed wire board includes electrically conductive tracing. The combining of the modules with the framework includes joining each module to at least one edge-segment so that the tracing is electrically connected to the electrical wiring. Each electrical component is electrically connected to the tracing of at least one module. Each electrical component is selected from the group consisting of capacitor, resistor, inductor, diode, rectifier, transistor, and integrated circuit. Each structural component includes at least one material region, and does not include a printed wire board. The combining of the structural components with the framework includes joining each structural component to at least one edge-segment.

The at least one material layer of a module is characterized by ferromagnetism and electrical conductivity. The at least one material region of a structural component is characterized by ferromagnetism and electrical conductivity. The material layers (of the modules) and the material regions (of the structural components) are dimensionally scaled for electromagnetic simulation of the full-scale structure. The tracings, the electronic components, and the electrical wiring are electrically connected for electromagnetic simulation of the magnetic signature reduction apparatus.

The present invention uniquely applies the broad concept of modularity to electromagnetic physical scale modeling of vessels such as ships. Typical practice of the present invention's modularized modeling methodology provides a reduced-scale electromagnetic physical scale model (PSM) of a full-scale vessel. The components of a typical embodiment of an inventive PSM are easily connected in modular fashion. In terms of the broad concept of modularity, inventive practice bears some resemblance to modular construction practice that is commonplace in conventional shipbuilding.

According to typical inventive practice, inventive modules include a printed wiring board (PWB), synonymously referred to herein as a printed circuit board (PCB). The inventive modules also include ferromagnetic material and electrically conductive material. Depending on the inventive embodiment, the ferromagnetic material and the electrically conductive material are the same material, or are combined different materials, or are separate different materials. Degaussing of the full-scale vessel is accurately represented by the inventive PSM using the circuitry included in the printed circuit board elements of the inventive modules, along with other electronic elements. Magnetization of the full-scale vessel is accurately represented by the inventive PSM using its modular and nonmodular structural elements, e.g., flat or curved structures, or coatings/layers/skins thereof. The ferromagnetic and electrically conductive materials that are included in the inventive structural elements correspond to similarly or equivalently constituted parts of the full-scale vessel, such as hull sections, decks, and bulkheads.

Inventive physical scale models are more easily constructed and are more easily modified than are conventional physical scale models. The internal components of an inventive PSM are easily accessible for modification. The present invention's facile replacement of external components (e.g., hull sections) and internal components (e.g., modules or boards) facilitates testing of design alternatives, thus shortening test/retest cycles and expanding individual model utilities to wider ranges of scale model testing.

Additional benefits of inventive practice of physical scale modeling are reduced cost, speedier evaluation, and expanded model usefulness. In sum, inventive physical scale modeling represents a more efficient, more economical, and more flexible alternative to conventional physical scale modeling.

Other objects, advantages and features of the present invention will become apparent from the following detailed description of the present invention when considered in conjunction with the accompanying drawings.

BRIEF DESCRIPTION OF THE DRAWINGS

The present invention will now be described, by way of example, with reference to the accompanying drawings, wherein like numbers indicate same or similar parts or components, and wherein:

FIG. 4 and FIG. 5 are similar diagrams that together illustrate, by way of example of inventive practice, mechanical connectivity of modules with respect to the framework. In particular, FIG. 4 and FIG. 5 illustrate a "tongue-and-groove" joint technique that may be practiced (for example, in a manner such as depicted in FIG. 3) in joining modules to a framework's linear edge-segments, in accordance with many embodiments of the present invention. A typical linear edge-segment in inventive practice is a generally rectangular-beam-shaped structure that is "tongue-and-grooved" on at least one geometric side (face); FIG. 4 and FIG. 5 show a tongue-and-groove configuration on one side (the right side, as shown) of the linear edge-segment.

The module-to-framework connection can be male-to-female (lower connection, as shown) or female-to-male (upper connection, as shown).

FIG. 6 and FIG. 7 are similar diagrams that together illustrate, by way of example of inventive practice, end-to-end (edgewise) mechanical connectivity, in "tongue-and-groove" manner, of two different modules with respect to each other. According to typical inventive practice, each pair of modules is mutually connected, both mechanically and electrically.

FIG. 8 is a perspective view of a doubly tongue-and-grooved embodiment of a linear edge-segment in accordance with the present invention. The linear edge-segment shown in FIG. 8 is a generally rectangular-beam-shaped member that—as distinguished from the linear edge-segments shown in FIG. 4 and FIG. 5—is tongue-and-grooved on two adjacent geometric sides (faces).

FIG. 9 is an edge-on elevation view of an embodiment of an electronic structural module in accordance with the present invention. The inventive module shown in FIG. 9 includes a skin/coating/layer that is both ferromagnetic and electrically conductive.

FIG. 10 is an edge-on elevation view of a different embodiment of an electronic structural module in accordance with the present invention. As distinguished from the inventive module shown in FIG. 9, the inventive module shown in FIG. 10 includes a ferromagnetic skin/coating/layer and an electrically conductive layer adjacent thereto.

FIG. 11 is a side elevation cross-sectional view of an embodiment of a linear edge-segment of a framework in accordance with the present invention, cross-sectioned to reveal an electrical wire longitudinally disposed therein. Like the linear edge-segments shown in FIG. 4 and FIG. 5, the linear edge-segment shown in FIG. 11 is depicted as a generally rectangular-beam-shaped member that is "tongue-and-grooved" on one geometric side/face.

Figure 12:
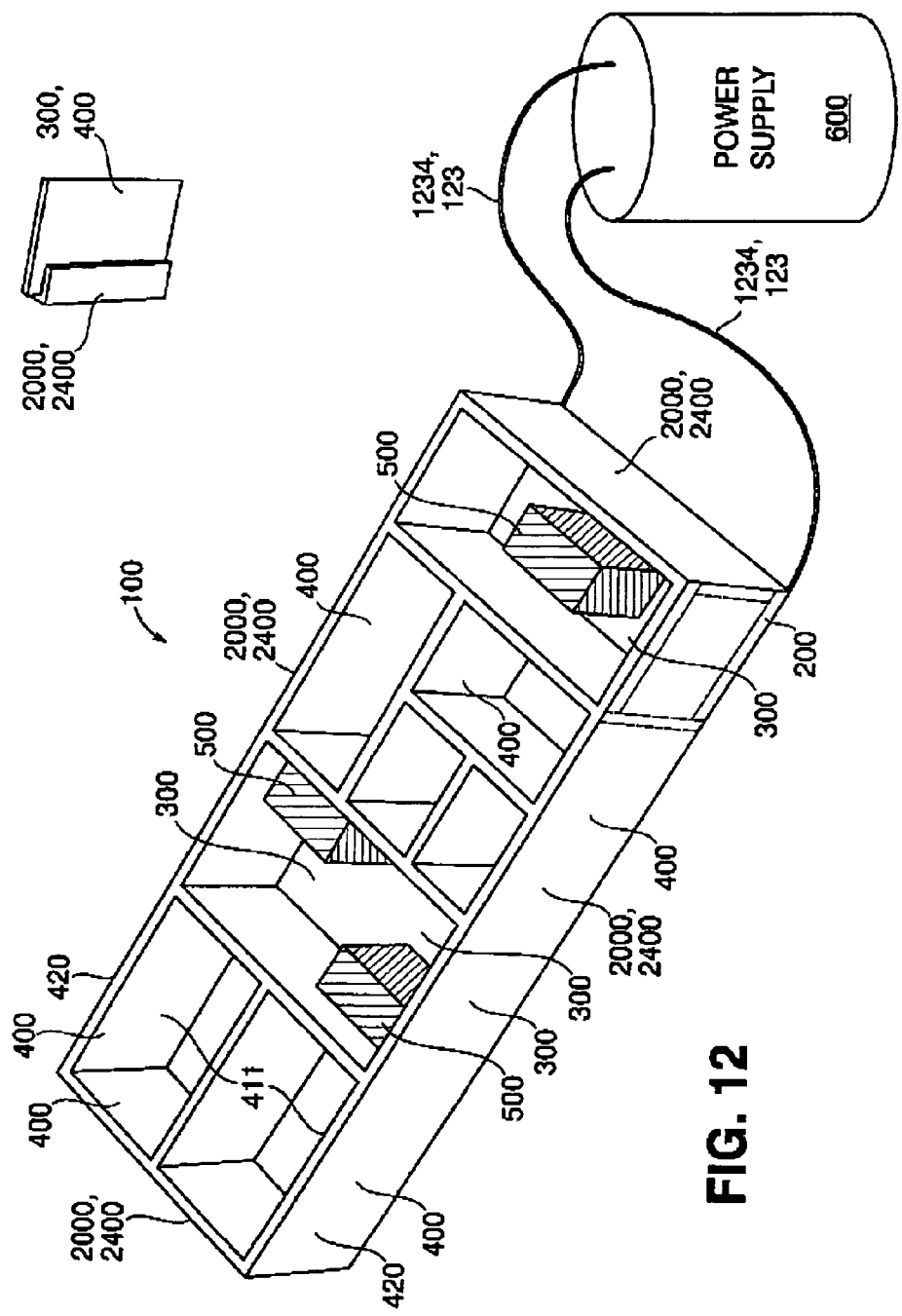

FIG. 12 is a perspective view of a portion of an embodiment of an electromagnetic physical scale model in accordance with the present invention. FIG. 12 can also be considered to be representative of the "solid frame" mode of inventive practice, as distinguished from the "open frame" mode (synonymously referred to herein as the "skeletal frame" mode) of inventive practice, which is exemplified by FIG. 1 through FIG. 5, FIG. 10, and FIG. 11. The modules and other parts and components of the inventive electromagnetic physical scale model are shown by way of example of inventive practice.

Figure 13:
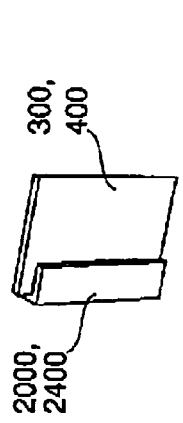

FIG. 13 is a diagram illustrating, by way of example of inventive practice, edgeways in-groove connection of a module with the grooved inner wall of a side panel that is included in a box frame.

Figure 1:
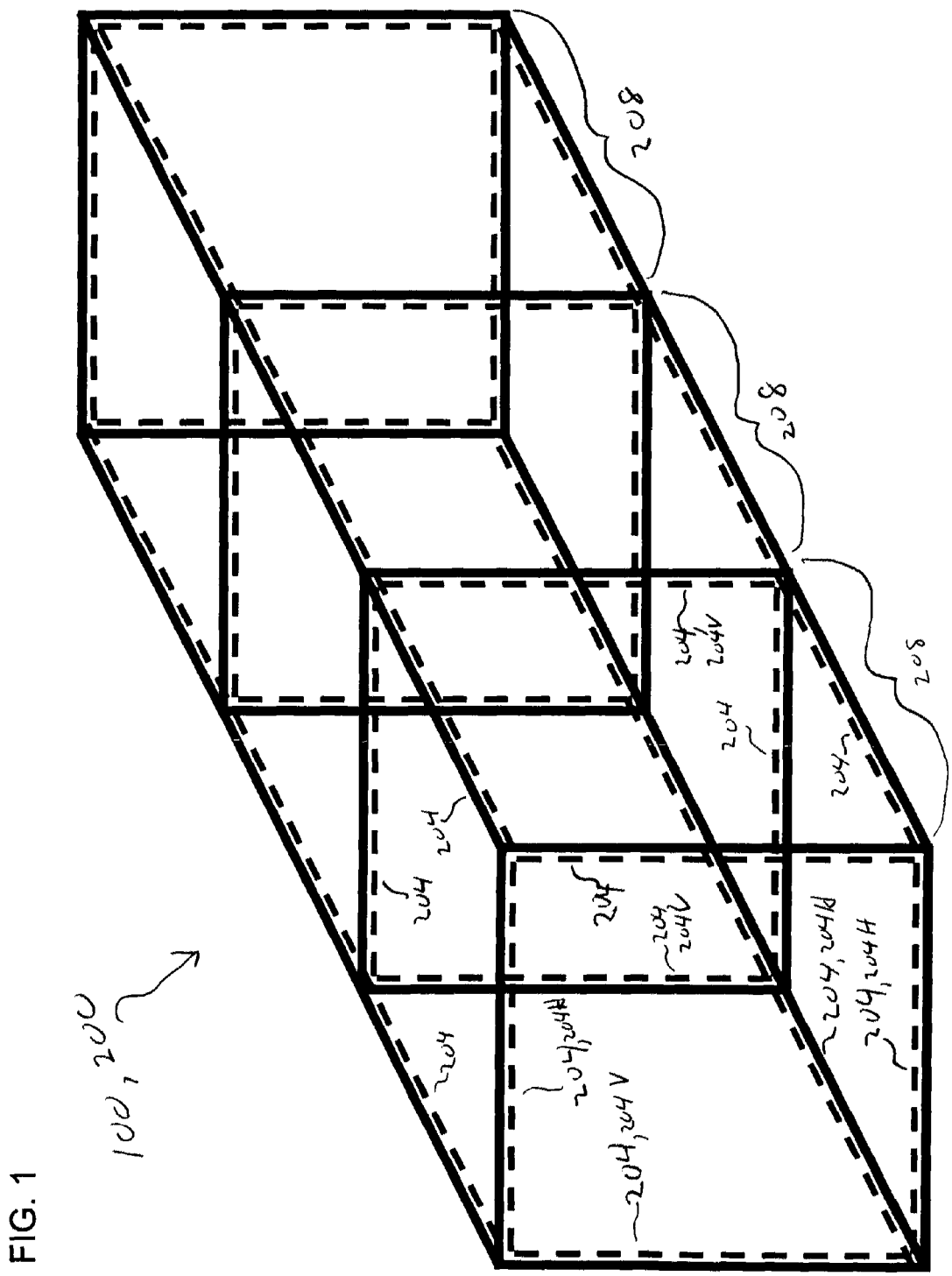
FIG. 1 is a perspective view of the framework of a typical embodiment of an electromagnetic physical scale model in accordance with the present invention. The framework shown in FIG. 1 is a "skeletal" frame having three compartments.
Figures 14, 15:
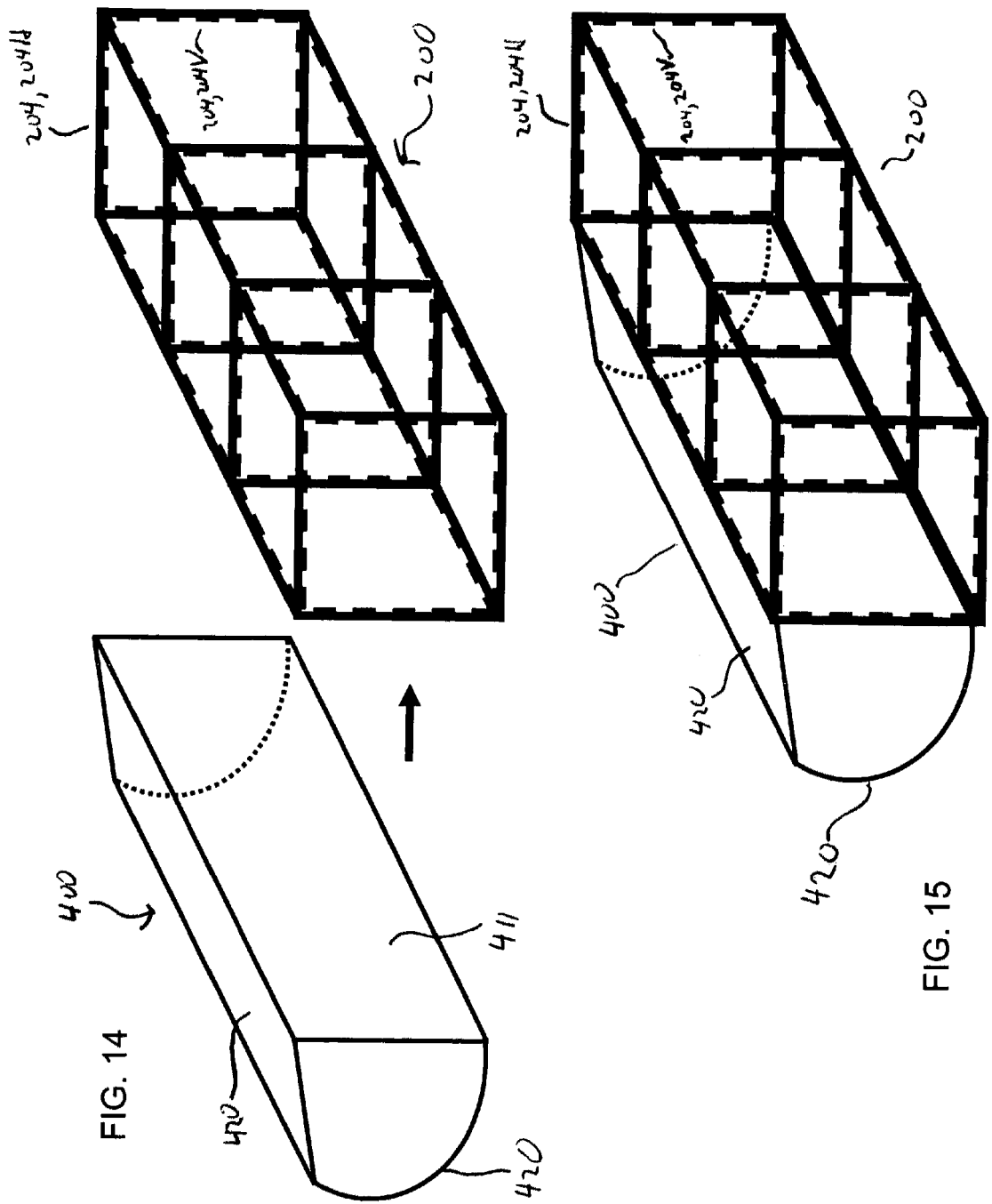

FIG. 14 and FIG. 15 are similar diagrams that together illustrate, by way of example of inventive practice, mechanical connectivity of a curvilinear hull module with respect to the present invention's skeletal main frame shown in FIG. 1. FIG. 14 and FIG. 15 can also be considered to be representative of mechanical connectivity of a curvilinear hull module with respect to the present invention's box main frame such as shown in FIG. 11.

DESCRIPTION OF EXEMPLARY
EMBODIMENTS OF THE INVENTION

Figure 2:
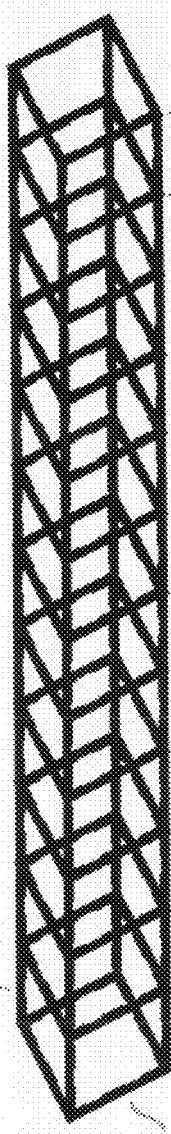
FIG. 2 is perspective view of a similar but more elongate version of the present invention's framework shown in FIG. 1. The framework shown in FIG. 2 has twelve compartments.
Figure 3:
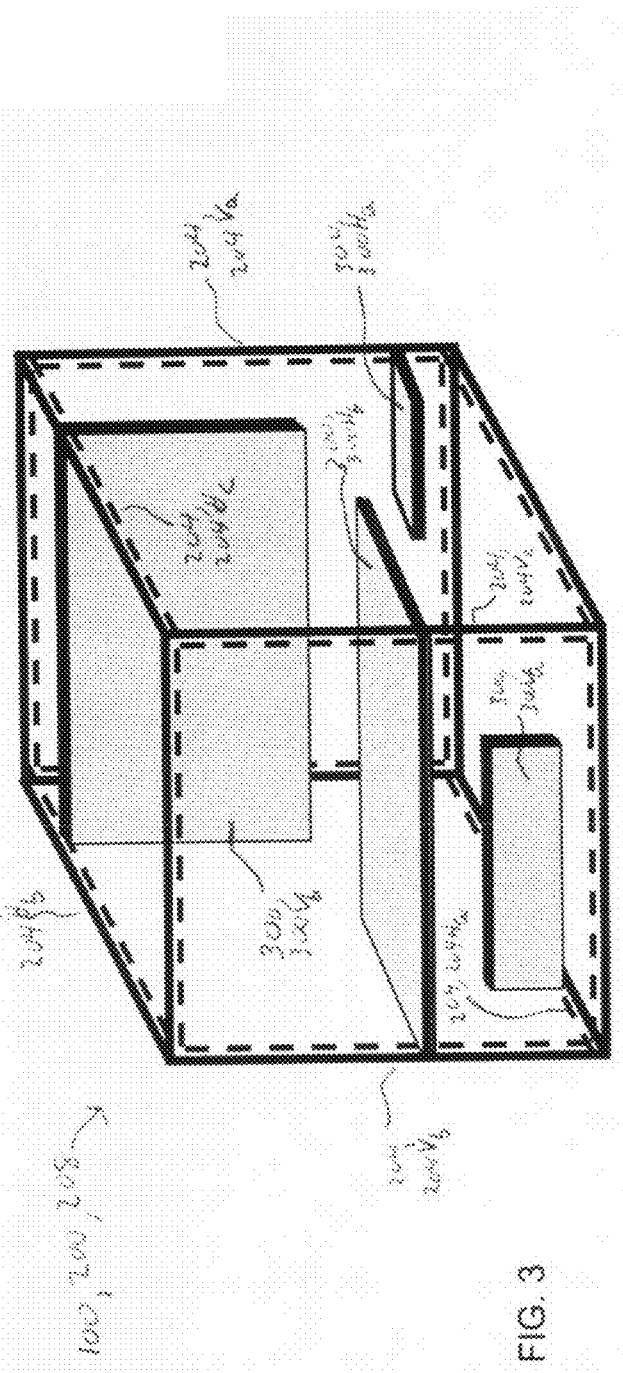
FIG. 3 is a perspective view, similar to the view of FIG. 1, of one of the compartments of the framework shown in FIG. 1, and of four different inventive modules connected at different locations of the framework. The modules and their connections to the framework are illustrated by way of example of inventive practice. According to typical inventive practice, each module is connected both mechanically and electrically to the framework.

Referring now to FIG. 1 through FIG. 3, construction of an exemplary embodiment of inventive electromagnetic physical scale model (PSM) 100 begins with the provision of an "open" ("skeletal") structural framework 200 that includes linear edge-segments 204. The edge-segments 204 are neither ferromagnetic nor electrically conductive. Frameworks 200 portrayed in FIG. 1 through FIG. 3 are each characterized by a rectangular prismatic ("box") geometric shape, and hence by symmetry with respect to a longitudinal axis. The rectangular prismatic (box-shaped) framework 200 shown in FIG. 3 includes eight horizontal linear edge-segments and four vertical linear edge-segments, thus defining the geometric edges of a single geometric rectangular prism.

Alternatively, a rectangular prismatic framework 200 can be constructed to describe plural "sections" 208, such as shown in FIG. 1 and FIG. 2. The rectangular prismatic framework shown in FIG. 1 has three rectangular prismatic sections. The rectangular prismatic framework 200 shown in FIG. 2 is akin to the rectangular prismatic framework 200 shown in FIG. 1, but is a longer rendition having twelve rectangular prismatic sections 208. Designating "n" to be the total number of sections 208 in a rectangular prismatic framework 200, the total number of edge-segments is 8n+4, the total number of horizontal edge-segments is 6n+2, and the total number of vertical edge-segments is 2n+2. The rectangular prismatic framework 200 shown in FIG. 1 has three rectangular prismatic sections 208. As shown in FIG. 1, each section 208 is defined by four upper horizontal edge-segments 204H, four lower horizontal edge-segments 204H, and four vertical edge-segments 204V.

Although framework 200 is shown in FIG. 1 through FIG. 3 to include horizontal and vertical edge-segments 204 that are arranged to overall describe a rectangular prism, it is to be understood that inventive practice can provide for an inventive framework 200 having any of a variety of geometric shapes. Inventive practice will frequently involve physical scale modeling of vehicular structures that are characterized by axial symmetry; accordingly, inventive practice will frequently provide for frameworks 200 that are characterized by axial symmetry. Examples of axially symmetrical geometric shapes that may be suitable for inventive practice include triangular prism, pentagonal prism, hexagonal prism, heptagonal prism, octagonal prism, etc. An inventive framework 200 will normally be of such geometric character as to readily lend itself to constructive amplification through modular addition of parts and components, in an inventive manner such as illustrated in FIG. 3.

Still referring to FIG. 3 and also referring to FIG. 4 through FIG. 8, electronic structural modules 300 are joined at various locations to load-bearing skeletal framework 200. Although the present invention's framework 200 is frequently embodied to be characterized by two or more sections 208, for illustrative purposes a single section 208 is depicted in FIG. 3. As shown in FIG. 3, each module 300 is a modular plate-like entity and is joined to one or two edge-segments 204. Horizontal module $300H_a$ is joined at one end to vertical edge-segment $204V_a$. Horizontal module $300H_b$ is joined at opposite ends to vertical edge-segments $204V_b$ and $204V_c$. Vertical module $300V_a$ is joined at one end to horizontal edge-segment $204H_a$. Vertical module $300V_b$ is joined at opposite ends to horizontal edge-segments $204H_b$ and $204H_c$.

The inventive practitioner can exercise judgment as to the number of joints or joint locations that will suffice to effect stable attachment of a module 300 with respect to a framework 200. Inventive design would tend to require greater load-bearing capabilities of horizontal modules 300 (for instance, simulative of ship decks) than of vertical modules 300, particularly insofar as bearing the respective weights of various electronic components 500. Instead of an easily adjustable attachment technique (e.g., "tongue-and-groove"), modules 300 can be more permanently affixed to a framework 200, such as via mechanical fastening (e.g., screwing or bolting) or adhering (e.g., gluing or bonding). In the light of this disclosure, the skilled artisan will appreciate these and other of the various ways in which attachment can be accomplished of modules 300 to edge-segments 204, or of modules 300 to each other, or of structural components 400 to edge-segments 204. For example, one or more fasteners such as friction pins can be used in conjunction with tongue-and-groove mating to render a joint more secure.

Tongue-and-groove technique may be propitious when inventive practice favors quick and facile removals, additions, and rearrangements of various elements of an inventive model 100. For instance, as depicted in FIG. 4 and FIG. 5, edge-segment 204 and module 300 are characterized by complementary "tongue-and-groove" configurations for effecting their mutual joining. In the upper joint shown in FIG. 4 and FIG. 5, the "tongue" is the ridge 251 of edge-segment 204, and the "groove" is the slot 353 of module $300_1$. In the lower joint shown in FIG. 4 and FIG. 5, the "groove" is the slot 253 of edge-segment 204, and the "tongue" is the ridge 351 of module $300_1$.

Similarly illustrated by way of example in FIG. 6 and FIG. 7, modules $300_1$ and $300_2$ are characterized by complementary tongue-and-groove configurations for effecting joining to each other. As shown in FIG. 6 and FIG. 7, the "tongue" is the ridge 351 of module $300_1$, and the "groove" is the slot 353 of module $300_2$. An alternative technique, similar in principle to the technique that is shown in FIG. 4 through FIG. 7, uses a separate member, viz., a "tongue-in-groove" member (not shown), to couple a module 300 and an edge-segment 204, or to couple two modules 300. The tongue-in-groove member is interposed between two entities (e.g., an edge-segment 204 and a module 300, or two modules 300) that are grooved and/or slotted in a complementary fashion with respect to the tongue-in-groove member.

Edge-segment 204 is shown in FIG. 4 and FIG. 5 to generally describe an elongate rectangular prismatic shape, and to have a tongue-and-groove configuration along one of its four rectangular sides. A typical linear edge-segment 204 according to inventive practice is a generally rectangular-beam-shaped member that is tongue-and-grooved on one, two, three, or all four geometric longitudinal sides/faces. The linear edge-segment 204 shown in FIG. 4 and FIG. 5 is shown to be tongue-and-grooved on one side. In the light of the instant disclosure, the linear edge-segment shown in FIG. 4 and FIG. 4 is readily envisioned to be tongue-and-grooved on plural longitudinal sides/faces. For instance, the linear edge-segment shown in FIG. 8 is shown to be tongue-and-grooved on two adjacent longitudinal sides/faces.

Of particular importance in inventive practice is the electromagnetic integrity of inventive model 100 vis-à-vis the full-scale ship. Inventive model 100 should provide a true representation of the electromagnetic effects associated with both (i) the full-scale ship's structure and (ii) the full-scale ship's degaussing system. Generally speaking, electromagnetic effects of structural materials are associated with both their ferromagnetic properties and their electrically conductive properties. Electrical conductivity of various portions of the full-scale ship could be accounted for even if magnetic signature is the manifestation of primary interest, since electricity can have concomitant effects (such as eddy currents) that are associated with magnetism.

According to typical inventive practice, the electromagnetic effects associated with the full-scale ship's structure are represented in a dimensionally scaled fashion, and the electromagnetic effects associated with the full-scale ship's degaussing system are represented in a dimensionally scaled fashion. The dimensional scaling in each of these categories (i.e., structure and degaussing) is based on electromagnetic principles understood by the ordinarily skilled artisan who reads the instant disclosure. The framework 200, as typically embodied, is nonferromagnetic and electrically non-conductive. The ferromagnetic and electrically conductive material portions of inventive model 100—viz., the ferromagnetic and electrically conductive layers of the modules 300, and the ferromagnetic and electrically conductive regions of the non-modular structural components 400—determine the electromagnetic effects associated with the full-scale marine vessel's structure.

With reference to FIG. 9 and FIG. 10, each electronic structural module 300 is dually attributed with a structural quality and an electronic quality. The module 300' shown in FIG. 9 includes a printed wiring board 310 and one material layer $320_{FC}$. Material layer $320_{FC}$ is both ferromagnetic and electrically conductive. The module 300" shown in FIG. 10 includes a printed wiring board 310 and two different material layers 320, viz., one ferromagnetic material layer $320_F$ and one electrically conductive material layer $320_C$. The ferromagnetic material layer and the electrically conductive material layer are depicted in FIG. 10 as being adjacent to each other; nevertheless, it is to be understood that inventive practice requires neither adjacency of ferromagnetic material layers with respect to each other, nor adjacency of electrically conductive material layers with respect to each other, nor adjacency of ferromagnetic material layers and electrically conductive material layers with respect to each other. As shown in both FIG. 9 and FIG. 10, printed wiring board 310 includes a substrate 311 and a tracing (e.g., etching) 312. Substrate 311 is nonferromagnetic and electrically nonconductive; tracing 312 is electrically conductive.

Typical embodiments of inventive module 300 are made by providing at least one layer 320 (e.g., coating, depositing, or painting) of material upon a printed wiring board 310 (e.g., a commercially available off-the-shelf printed wiring board 310), wherein the material thus applied is characterized by both ferromagnetism and electrical conductivity. Layer 320 is provided on the printed wiring board 310's circuitous surface, which contains tracing 312. Printed wiring board 310's circuitous surface is the side opposite the printed wiring board 310's connective surface, which permits electrical connections of electronic components 500 to tracing 312, such as diagrammatically represented in FIG. 12.

The connections between modules 300 and framework 200 are not only mechanical but are also electrical. Reference now being made to FIG. 11, linear edge-segment 204 includes an electrically conductive wire 234 running longitudinally therethrough. When a module 200 is joined with linear edge-segment 204 in a manner such as illustrated in FIG. 4 and FIG. 5, an electrical connection is established between module 200's tracing 312 and edge-segment 204's wire 234. Depending on the inventive embodiment, this electrical connection is made through direct and/or indirect electrical contact between tracing 312 and wire 234. For instance, indirect electrical contact can be achieved or facilitated by implementing one or more auxiliary electrically conductive members, such as electrically conductive runs 390 shown as included in modules 300' and 300" in FIG. 9 and FIG. 10, respectively.

Now referring to FIG. 12 through FIG. 15, in order to accurately duplicate the electromagnetic effects of the full-scale structure and of the magnetic signature reduction apparatus associated therewith, devices in addition to framework 200 and modules 300 are utilized in typical inventive practice. Such additional devices include "non-modular" structural components 400 and electronic components 500. The term "structural component," as used herein in context of inventive practice, broadly refers to any structural entity that includes ferromagnetic and electrically conductive material, but—as distinguished from a "module"—does not include electronic circuitry. The term "electronic component," as used herein in context of inventive practice, broadly refers to any electronic device that admits of electrical connection with the printed wiring board 310 of a module 300. Possible electronic components 500 include, but are not limited to, capacitors, resistors, inductors, diodes, rectifiers, transistors, and integrated circuits.

The structure-associated electromagnetic effects are inventively duplicated by providing ferromagnetic and electrically conductive material in appropriate amounts and configurations and at appropriate locations as part of the inventive model 100. Typical inventive practice provides for these ferromagnetic and electrically conductive portions of the full-scale ship to be duplicated in the modules 300 and non-modular structural components 400 of the inventive model 100.

The degaussing-associated electromagnetic effects are duplicated by appropriately rendering electrical connections among framework 200, modules 300, and electronic components 500—for instance, electrically connecting modules 300 with edge-segments 204 such as shown in FIG. 3 through FIG. 5, electrically connecting modules 300 with other modules 300 such as shown in FIG. 6 and FIG. 7, and electrically connecting electronic components 500 with modules 300 such as shown in FIG. 12.

As diagrammatically represented in FIG. 12, the degaussing circuit typically includes an ac or dc power supply 600. Inventive framework 100 can be variously embodied in terms of the interconnectedness of the corresponding wires 234 running through the edge-segments 204. According to frequent inventive practice, an integral electrically conductive wire network 1234 is disposed throughout inventive framework 100 and is appropriately exposed external to framework 100 for permitting one or more connections of wire leads 123 to one or more devices such as power supply 600 shown in FIG. 12.

Typical inventive practice makes use of multiple conductor layers (tracings 312) of the printed wiring boards 310 of the modules 300 so as to integrate, imitatively in a scaled manner, the runs of the full-scale ship's degaussing system into the modules 300, which may represent hull sections, bulkheads, and/or decks. By means of simple switching circuits, it is possible to design multiple and redundant wire runs on the PWBs 310; that is, through alternatively openings and closings the switches, it is possible to inventively evaluate a large number of potential degaussing system configuration runs quickly and easily. Furthermore, internal sensors can be patched directly into a PWB 310 wiring 234 scheme to permit the evaluation of degaussing designs. For added efficiency, degaussing loops can be integrated into a component with leads tapping into a PWB 310's wire backbone.

Structural components 400 are referred to herein as "non-modular" structural components, since modules 300 also represent a kind of structural component. Structural components 400 are not unlike modules 300, except that structures 400 lack electronic circuitry (e.g., including tracings 312), which modules 300 include. A structural component 400 typically includes a ferromagnetic and electrically conductive material region 420, analogous to a ferromagnetic and electrically conductive material layer 320 of a module 300. A structural component 400 also typically includes a nonferromagnetic and electrically nonconductive material region 411, analogous to a nonferromagnetic and electrically nonconductive substrate 311 of the printed wiring board 310 of a module 300.

A structural component 400 is typically made so as to initially include a nonferromagnetic and electrically nonconductive preform of a desired shape, simple or complex, and to subsequently include at least one coating of ferromagnetic and electrically conductive material, such as a suitable ferrous material. A structural component 400 can have any of diverse shapes, e.g., rectilinear or curvilinear. For instance, flat plate components 400 are shown in FIG. 12 to be attached on the outside of framework 200.

As another example, a curved wedge-shaped component 400 is shown in FIG. 14 and FIG. 15 to be attached on the outside of framework 200. A structural component 400 can be attached to a framework 200 in any of various ways. For instance, a structural component 400 can engage one or more linear edge-segments 204 in tongue-and-groove or tongue-in-groove fashion, similarly as described herein with regard to modules 300. Additionally or alternatively, structural components can be adhered (e.g., bonded or glued) or mechanically fastened (e.g., screwed or bolted) to a framework 200.

According to typical inventive practice, each module 300 is fabricated via a process including the treatment of a side/face surface of a printed wiring board 310 with a material 320 that is both ferromagnetic and electrically conductive, thereby providing a "dimensionally scaled" ferrous skin 320. Many structural components 400 are similarly made by providing a ferromagnetic and electrically conductive coating skin 420 upon a non-ferromagnetic and electrically nonconductive preform 411. Typically, the dimensional scaling of the ferromagnetic and electrically conductive material—whether it be the skin 320 of a module 300, or the skin 420 of a structural component 400—is not a straightforward linear proportion; rather, this dimensional scaling is a nonlinear proportion vis-à-vis the corresponding portion of the full-scale ship. This is because the change in magnitude of the structure's electromagnetic phenomena in accordance with change in the structure's size is a nonlinear function, not a linear function.

For instance, the thickness of the material layer 320 of a module 300 will typically be nonlinearly proportional to the thickness of the corresponding portion of the full-scale marine vessel. Similarly, the thickness of the material region 420 of a structural component 400 will typically be nonlinearly proportional to the thickness of the corresponding portion of the full-scale marine vessel. In practicing the present invention, the skilled artisan who reads the instant disclosure will be capable of applying known electromagnetic relationships in order to determine appropriate magnitudes (e.g., thicknesses) of ferromagnetic and electrically conductive material 320.

Construction of a conventional physical scale model tends to be labor-intensive. This is especially so for the conventional model's areas having complex physical characteristics, such as double-curved surfaces. Inventive practice will generally obviate extreme attention to configurative details, but nonetheless will frequently call for some degree of configurative similitude between the inventive PSM 100 and the full-scale vessel, especially insofar as mimicking the hull curvatures of the full-scale vessel.

The present invention can be practiced so as to uniquely apply known principles of stereolithographic (STL) fabrication for automatically and rapidly making complex features of an inventive physical scale model 100, such as forming shapes characterized by doubly curved surfaces. Two notable early patents disclosing stereolithography are Hull U.S. Pat. No. 4,575,330 issued 11 Mar. 1986 and Hull U.S. Pat. No. 4,929,402 issued 29 May 1990, each of which is incorporated herein by reference. According to typical inventive practice, modules 300 tend to flat plate-like structures, whereas structural components 400 can be flat plate-like structures but tend to be more complexly shaped structures having some degree of curvature (e.g., one or more curved surfaces), for instance in order to duplicate contoured hull geometries. Accordingly, stereolithograph technique will more often be inventively applied to the fabrication of structural components 400 than to the fabrication of modules 300.

According to typical embodiments of inventive construction involving stereolithography, each complexly shaped structure is stereolithographically manufactured using computer-aided design (CAD) drawings and raw (typically, polymeric) material that is neither ferromagnetic (ferrous) nor electrically conductive. The shape of the stereolithographically manufactured object is made to match the shape of the corresponding portion of the full-scale vessel. Other structural details, such as fasteners, tongue-and-grooves, and the like for facilitating attachment, can also be designed directly into the stereolithographically manufactured object.

The complexly shaped, non-ferrous, non-conductive object that has been stereolithographically produced, referred to herein as the "non-electromagnetic preform," is then treated (e.g., with one or more solid appliqués or liquid coatings) so as to be rendered electromagnetically suitable for inventive physical scale modeling. Both ferromagnetic and electrically conductive properties are to be imparted to each non-electromagnetic perform via the treatment. In this manner, electromagnetic behaviors of the full-scale vessel's structural components that are ferrous-conductive (i.e., both ferromagnetic and electrically conductive) can be simulated by the inventive PSM.

According to typical inventive practice, both ferromagnetic and electrically conductive properties are accounted for by the inventive PSM 100, since the overall magnetic signature of the full-scale vessel is defined by the sum of "permanent" magnetism and "induced" magnetism. The latter can include either or both of magnetically induced magnetism and electrically induced magnetism (such as involving eddy currents). A ferrous-conductive material commonly used in modern ship construction is steel, which at least largely constitutes the hull, decks, and bulkheads of many modern ships.

For example, a non-electromagnetic (i.e., nonferrous and nonconductive) preform can be coated (e.g., sprayed, appliquéd, etc.) on one side with one or more paints or appliqués, the resultant coating serving to simulate the ferrous and electrically conductive behavior of the corresponding portion of the vessel. Each applied paint or appliqué is either electrically conductive, or ferromagnetic, or both electrically conductive and ferromagnetic. Various paints are commercially available for such purposes, such as electrically conductive and/or ferrous-doped paints.

The ferrous amount that is applied to a preform can vary from preform to preform, depending on the full-scale portion to which it corresponds. A typical ship has some regions of greater ferrous content and other regions of lesser ferrous content—for instance, thicker versus thinner skins, larger versus smaller stiffeners, etc. The ferrous exterior layer that is applied to one side of the preform is "dimensionally scaled"; more specifically, the ferrous exterior layer is applied in an appropriate amount (for instance, in terms of describing the appropriate physical dimensions such as including thickness) to simulate, in an accurately scaled fashion, the electromagnetic behavior of the corresponding portion of the full-scale ship.

FIG. 12 is but an example of inventive practice providing for an "open" ("skeletal") framework 200. The open framework 200 is "filled in" around its perimeter by flat plate-like structural components 400 that are attached to framework 200, wherein the ferromagnetic and electrically conductive surfaces of structural components 400—the hull-imitative surfaces of inventive model 100—are attached on the outside of framework 200. Instead of or in addition to flat plate-like structural components 400, flat plate-like modules 400 can be similarly attached to framework 200.

An alternative mode of inventive practice, of which FIG. 12 can also be considered to be representative, provides for a "solid" framework 2000, as distinguished from a "skeletal" framework 200 such as exemplified in FIG. 1 through FIG. 3. As alternatively depicted in FIG. 12, solid framework 2000 includes four vertical plates 2400 describing a rectangular prism shape. Each plate 2400 constitutes a nonferromagnetic and electrically nonconductive substrate having at least one tongue-and-grooved side.

Around the exterior of framework of 2000, the four plates 2400 can be selectively coated with ferromagnetic and electrically nonconductive material, and/or can have one or more structural components 400 attached thereto, thereby duplicating the ferromagnetic and electrically conductive composition of the full-scale ship's hull. Each plate 2400 can be tongue-and-grooved on its interior surface for securely engaging modules 200 in a manner such as illustrated in FIG. 13. Framework 2000 can thus be interiorly lined with tongue-and-grooving for attachment of modules 300 and structural components 400, and can be either exteriorly smooth/even (for being coated with ferromagnetic and electrically conductive material) or tongue-and-grooved (for having structural items, e.g., modules 300 and/or structural components 400, attached thereto).

The present invention, which is disclosed herein, is not to be limited by the embodiments described or illustrated herein, which are given by way of example and not of limitation. Other embodiments of the present invention will be apparent to those skilled in the art from consideration of the instant disclosure, or from practice of the present invention. Various omissions, modifications and changes to the principles disclosed herein may be made by one skilled in the art without departing from the true scope and spirit of the present invention, which is indicated by the following claims.

What is claimed is:

1. A physical scale model suitable for magnetic signature evaluation of a full-scale structure having magnetic signature reduction apparatus associated therewith, the physical scale model comprising a framework and plural modules, said framework including electrical wiring and plural edge-segments, said edge-segments forming an at least substantially axially symmetrical geometric shape, each said module including a printed wire board and at least one material layer situated upon said printed wire board, said at least one material layer being characterized by ferromagnetism and electrical conductivity, said printed wire board including electrically conductive tracing, at least one said module being joined to at least one said edge-segment so that said tracing is electrically connected to said electrical wiring, wherein:
    said axially symmetrical geometric shape is a rectangular prismatic geometric shape;
    said edge-segments are linear;
    each said edge-segment is either horizontal or vertical;
    each said module has an at least substantially planar shape;
    each said module is joined to at least one said edge-segment so as to be either horizontal or vertical;
    the full-scale structure is a marine vessel;
    each said module that is horizontal corresponds to either a hull section of said marine vessel or a deck of said marine vessel;
    each said module that is vertical corresponds to either a hull section of said marine vessel or a bulkhead of said marine vessel.

2. A physical scale model, suitable for magnetic signature evaluation of a full-scale structure having magnetic signature reduction apparatus associated therewith, the physical scale model comprising a framework and plural modules, said framework including electrical wiring and plural edge-segments, said edge-segments forming an at least substantially axially symmetrical geometric shape, each said module including a printed wire board and at least one material layer situated upon said printed wire board, said at least one material layer being characterized by ferromagnetism and electrical conductivity, said printed wire board including electrically conductive tracing, at least one said module being joined to at least one said edge-segment so that said tracing is electrically connected to said electrical wiring, wherein:
    said axially symmetrical geometric shape is a rectangular prismatic geometric shape;
    said edge-segments are linear;
    each said edge-segment is either horizontal or vertical;
    each said module has an at least substantially planar shape;
    each said module is joined to at least one said edge-segment so as to be either horizontal or vertical;
    said at least one material layer is dimensionally scaled in furtherance of simulating electromagnetic effects of a corresponding portion of said full-scale structure;
    said electrical connection of said tracing to said electrical wiring is in furtherance of simulating electromagnetic effects of a corresponding portion of said magnetic signature reduction apparatus.

3. A physical scale model suitable for magnetic signature evaluation of a full-scale structure having magnetic signature reduction apparatus associated therewith, the physical scale model comprising a framework and plural modules, said framework including electrical wiring and plural edge-segments, said edge-segments forming an at least substantially axially symmetrical geometric shape, each said module including a printed wire board and at least one material layer situated upon said printed wire board, said at least one material layer being characterized by ferromagnetism and electrical conductivity, said printed wire board including electrically conductive tracing, at least one said module being joined to at least one said edge-segment so that said tracing is electrically connected to said electrical wiring, the physical scale model further comprising at least one electrical component, each said electrical component being electrically connected to said tracing of at least one said module, wherein:
    said axially symmetrical geometric shape is a rectangular prismatic geometric shape;
    said edge-segments are linear;
    each said edge-segment is either horizontal or vertical;
    each said module has an at least substantially planar shape;
    each said module is joined to at least one said edge-segment so as to be either horizontal or vertical;
    said electrical connection of said electrical component to said tracing is in furtherance of simulating electromagnetic effects of a corresponding portion of said magnetic signature reduction apparatus;
    each said electrical component is selected from the group consisting of capacitor, resistor, inductor, diode, rectifier, transistor, and integrated circuit.

4. A physical scale model suitable for magnetic signature evaluation of a full-scale structure having magnetic signature reduction apparatus associated therewith, the physical scale model comprising a framework and plural modules, said framework including electrical wiring and plural edge-segments, said edge-segments forming an at least substantially axially symmetrical geometric shape, each said module including a printed wire board and at least one material layer situated upon said printed wire board, said at least one material layer being characterized by ferromagnetism and electrical conductivity, said printed wire board including electrically conductive tracing, at least one said module being joined to at least one said edge-segment so that said tracing is electrically connected to said electrical wiring, the physical scale model further comprising at least one structural component and at least one electrical component, each said structural component being joined to at least one said edge-segment, each said structural component not including a said printed wire board and including at least one material region, said at least one material region being characterized by ferromagnetism and electrical conductivity, each said electrical component being electrically connected to said tracing of at least one said module, wherein:

said axially symmetrical geometric shape is a rectangular prismatic geometric shape;
said edge-segments are linear;
each said edge-segment is either horizontal or vertical;
each said module has an at least substantially planar shape;
each said module is joined to at least one said edge-segment so as to be either horizontal or vertical;
said at least one material region is in furtherance of simulating electromagnetic effects of a corresponding portion of said full-scale structure;
said electrical connection of said electrical component to said tracing is in furtherance of simulating electromagnetic effects of a corresponding portion of said magnetic signature reduction apparatus;
each said electrical component is selected from the group consisting of capacitor, resistor, inductor, diode, rectifier, transistor, and integrated circuit.

5. The physical scale model of claim 4, wherein the full-scale structure is a marine vessel, and wherein each said module and each said structural component corresponds to either a hull section of said marine vessel, or a deck of said marine vessel, or a bulkhead of said marine vessel.

6. The physical scale model of claim 5, wherein:

said edge-segments and said modules are characterized by complementary tongue-and-groove configurations for effecting joining of each said module to at least one said edge-segment:
at least two said modules are characterized by complementary tongue-and-groove configurations for effecting joining of at least two said modules to each other;
at least two said modules are joined to each other so that their respective said electrical tracings are connected to each other.

7. A method for making a physical scale model suitable for magnetic signature evaluation of a full-scale structure having magnetic signature reduction apparatus associated therewith, the method comprising:

providing a framework, said framework including electrical wiring and plural edge-segments, said edge-segments forming a geometric shape that at least substantially is axially symmetrical;
combining plural structural electronic modules with said framework, each said module including a printed wire board and at least one material layer situated upon said printed wire board, said at least one material layer being characterized by ferromagnetism and electrical conductivity, said printed wire board including electrically conductive tracing, said combining of said structural electronic modules with said framework including joining each said structural electronic module to at least one said edge-segment so that said tracing is electrically connected to said electrical wiring;
combining plural electrical components with said structural electronic modules, each said electrical component being electrically connected to said tracing of at least one said structural electronic module;
combining plural structural components with said framework, each said structural component not including a said printed wire board and including at least one material region, said at least one material region being characterized by ferromagnetism and electrical conductivity, said combining of said structural components with said framework including joining each said structural component to at least one said edge-segment;

wherein:
said physical scale model is generally representative of the geometric shape of the full-scale structure;
said material layers and said material regions are dimensionally scaled for electromagnetic simulation of said full-scale structure;
said tracings, said electrical components, and said electrical wiring are electrically connected for electromagnetic simulation of said magnetic signature reduction apparatus.

8. The method for making of claim 7, wherein each said electrical component is selected from the group consisting of capacitor, resistor, inductor, diode, rectifier, transistor, and integrated circuit.

* * * * *